(12) United States Patent
Kimura (10) Patent No.: US 8,312,334 B2
(45) Date of Patent: Nov. 13, 2012

(54) SEMICONDUCTOR TEST APPARATUS

(75) Inventor: Takahiro Kimura, Musashino (JP)

(73) Assignee: Yokogawa Electric Corporation, Musashino-shi, Tokyo (JP)

( * ) Notice: Subject to any disclaimer, the term of this patent is extended or adjusted under 35 U.S.C. 154(b) by 98 days.

(21) Appl. No.: 12/986,544

(22) Filed: Jan. 7, 2011

(65) Prior Publication Data

US 2011/0167306 A1 Jul. 7, 2011

(30) Foreign Application Priority Data

Jan. 7, 2010 (JP) ................................. 2010-001915

(51) Int. Cl.
*G01R 31/28* (2006.01)
(52) U.S. Cl. ..................................................... 714/743
(58) Field of Classification Search .................. 714/718, 714/724, 738, 743, 762, 768
See application file for complete search history.

(56) References Cited

U.S. PATENT DOCUMENTS

| 6,182,253 | B1 * | 1/2001 | Lawrence et al. ............. | 714/718 |
| 6,513,138 | B1 * | 1/2003 | Ohsawa ........................ | 714/738 |
| 6,546,503 | B2 * | 4/2003 | Ooishi .......................... | 714/6.2 |

FOREIGN PATENT DOCUMENTS

| JP | 07-098981 | A | 4/1995 |
| JP | 08-077794 | A | 3/1996 |
| JP | 09-035473 | A | 2/1997 |
| JP | 10-106288 | A | 4/1998 |
| JP | 11-045568 | A | 2/1999 |
| JP | 11-328995 | A | 11/1999 |
| JP | 2000-132964 | A | 5/2000 |
| JP | 2001-135082 | A | 5/2001 |
| JP | 2002-175689 | A | 6/2002 |
| JP | 2007-184069 | A | 7/2007 |
| JP | 2008-052770 | A | 3/2008 |
| JP | 2008-243323 | A | 10/2008 |

* cited by examiner

*Primary Examiner* — Shelly A Chase
(74) *Attorney, Agent, or Firm* — Westerman, Hattori, Daniel & Adrian LLP (57) ABSTRACT

A semiconductor test apparatus sorts addresses corresponding to memory cells in memory provided in a device under test, as well as failure data obtained as a result of testing the memory cells, and stores the sorted addresses and failure data in acquisition memory using burst access. The semiconductor test apparatus is provided with: an address generator configured to generate a burst target signal, which indicates that the addresses and failure data are target data for burst access; and a sort circuit configured to sort the addresses and failure data in order of continuous addresses suitable for burst access, on the basis of the burst target signal.

9 Claims, 9 Drawing Sheets

PRIOR ART

FIG. 10 PRIOR ART

SEMICONDUCTOR TEST APPARATUS

BACKGROUND OF THE INVENTION

1. Technical Field

A semiconductor test apparatus is disclosed that takes failure data obtained as the test results for memory cells and their corresponding addresses in memory provided in a device under test (hereinafter, DUT), sorts the failure data, and causes the data to be stored in acquisition memory by means of burst access. More particularly, a semiconductor test apparatus is disclosed that is able to write failure data to acquisition memory using burst access, even in cases when the number of addresses and failure data does not match the burst length or when irrelevant data is mixed in with the failure data, and wherein the number of memory devices constituting the acquisition memory can be reduced.

2. Description of the Related Art

In recent years semiconductor devices, particularly memory devices, have experienced dramatic increases in memory capacity, and the amount of failure data obtained as test results for memory cells and their corresponding addresses in memory is increasing.

In a semiconductor test apparatus, failure data is temporarily stored in acquisition memory, and the stored failure data is used in analysis and other processes. Typically, acquisition memory is realized by means of synchronous dynamic random access memory (SDRAM). Also, in a memory device test, the writing of failure data to acquisition memory uses SDRAM's read-modify-write operations (a series of operations wherein data that has been read out is modified, if necessary, and then written back), and thus the writing of failure data takes more time than ordinary write operations. For this reason, attempts are being made to reduce the amount of time involved in writing failure data to acquisition memory by using SDRAM's burst access functions.

In addition, acquisition memory is typically realized by means of a plurality of memory devices (such as SDRAM), and an interleaved technique is implemented to sequentially write data to this plurality of memory devices. When writing to a memory device that constitutes part of acquisition memory, the next set of failure data cannot be written to that memory device until the first write operation is finished. With the interleaved technique, failure data is written to the next memory device, without waiting for the first write operation to finish as above.

In other words, in order to continue writing failure data without a wait time, data must be written to the other memory devices by the time the memory device that was first written to becomes writeable again. For this reason, the number of memory devices increases as the write time for the memory devices constituting the acquisition memory increases.

Figure 8:
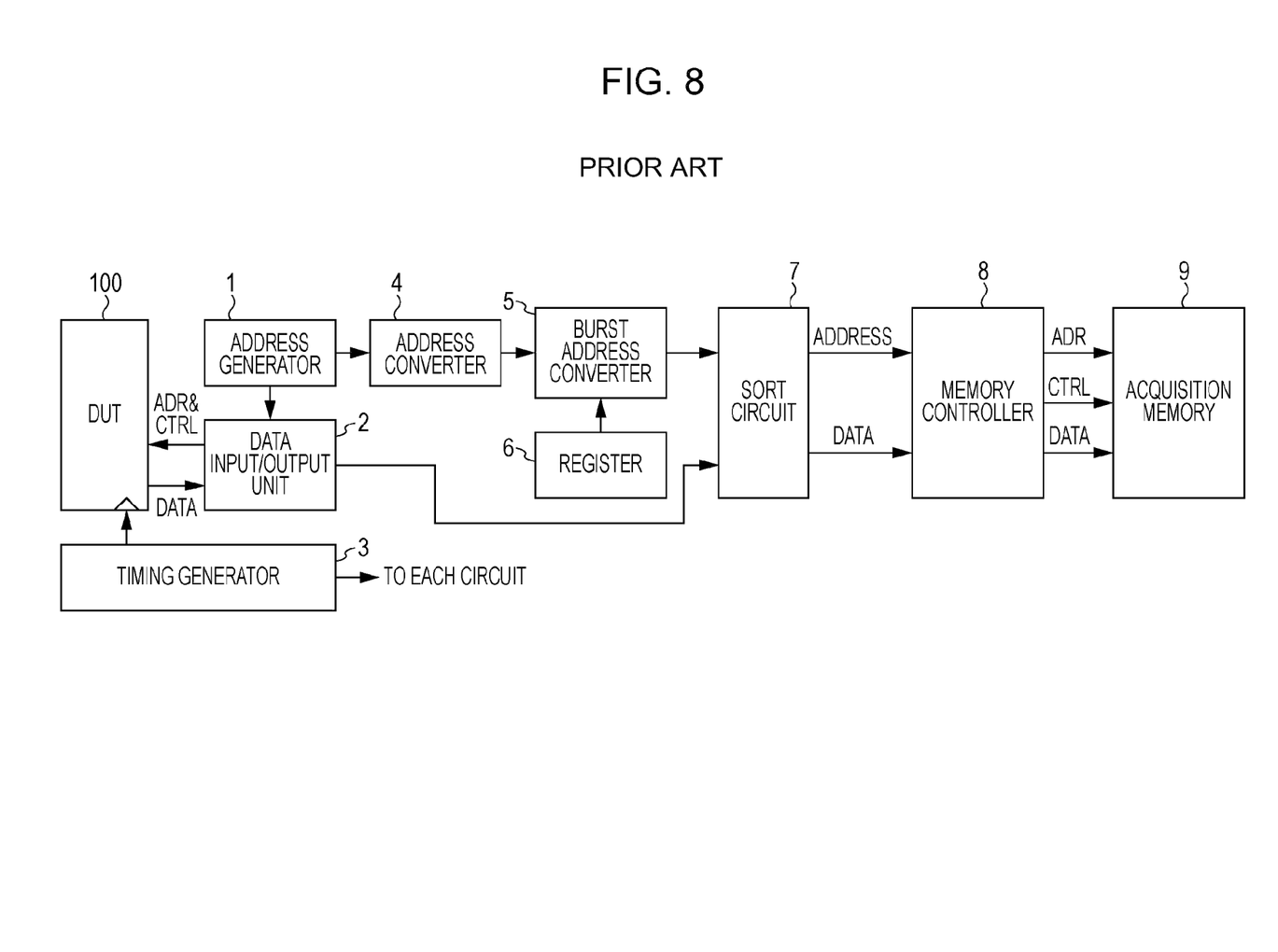
FIG. 8 illustrates one example of a semiconductor test apparatus of the related art.

FIG. 8 illustrates one example of a semiconductor test apparatus of the related art. The DUT 100 is a device under test. Ordinarily, in the case of a memory device test, a plurality of memory devices are tested simultaneously. The address generator 1 generates addresses corresponding to memory cells in the memory provided in the DUT 100. Ordinarily, memory cells are expressed by two-dimensional (2D) addresses (X address, Y address), and thus the address generator 1 generates 2D addresses.

The data input/output unit 2 includes: a signal generator circuit (not shown) that generates an address signal, data signal, and control signal input into the DUT 100; an output driver (not shown) that outputs a test signal to the DUT 100; a comparator (not shown) that compares the output signal from the DUT 100 to a preset comparison voltage; and a decision circuit (not shown) that compares the comparator output signal to expected value pattern data, and decides whether the information matches or does not match (pass/fail). The data input/output unit 2 outputs failure data that expresses the pass/fail obtained as a test result from the determination circuit.

The timing generator 3 generates timings for the edge of the test signal output from the driver of the data input/output unit 2 to the DUT 100, as well as timings for a signal (hereinafter referred to as the strobe signal) that determines the timings for comparing the output signal from the comparator of the data input/output unit 2 to the expected value pattern data. In addition, the timing generator 3 generates timings related to address generation and failure data collection.

The address converter 4 converts the 2D addresses generated by the address generator 1 into 1D addresses. Herein, the correspondence between an input 2D address and an output 1D address is determined in advance. The burst address converter 5 substitutes bits in the 1D address from the address converter 4 on the basis of conversion bit information set in the register 6.

During a test, if the 2D addresses generated by the address generator 1 vary discontinuously, the bits that vary are examined, and bits are substituted in the 1D address that was converted by the address converter 4. In so doing, address continuity can be kept. By varying addresses continuously, the burst access functions of SDRAM can be used. The 2D addresses generated by the address generator 1 are stated in advance in a test program by the user of the semiconductor test apparatus, and thus it is known where bits vary in the 2D addresses.

For this reason, the 1D addresses are made to vary continuously by moving the bit that varies to the lower order bits in the 1D addresses. In the conversion bit information in the register 6, information regarding the target bits to be moved to the lower order bits is set.

The sort circuit 7 takes an address from the burst address converter 5 and failure data corresponding to that address from the data input/output unit 2, resorts the data in the units required for burst access of the acquisition memory 9 (hereinafter referred to as the burst length), and outputs the result.

The memory controller 8 generates address signals, data signals, and control signals for the acquisition memory 9 on the basis of the address and failure data sorted by the sort circuit 7. The acquisition memory 9 is the device that stores the failure data. The acquisition memory 9 may be realized by means of SDRAM, for example, and includes burst access functions for continuously writing or reading data.

Figure 9:
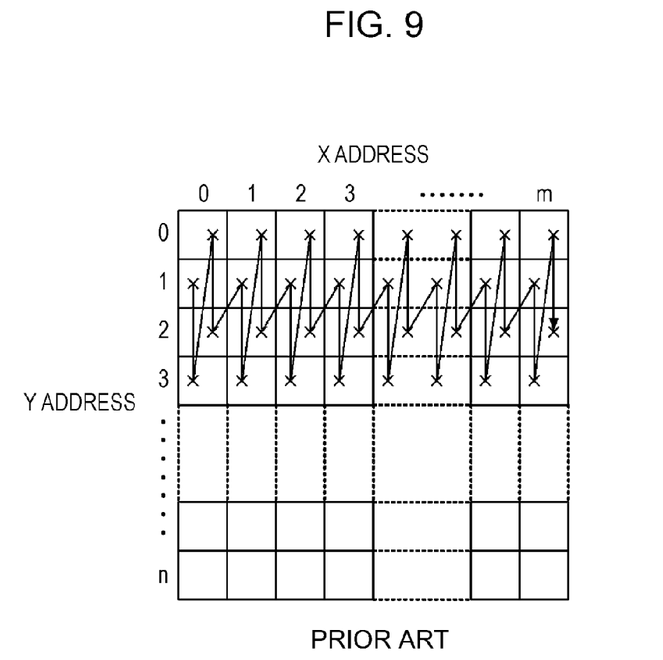
FIG. 9 explains one example of a memory cell in a memory device set as a DUT.
Figure 10:
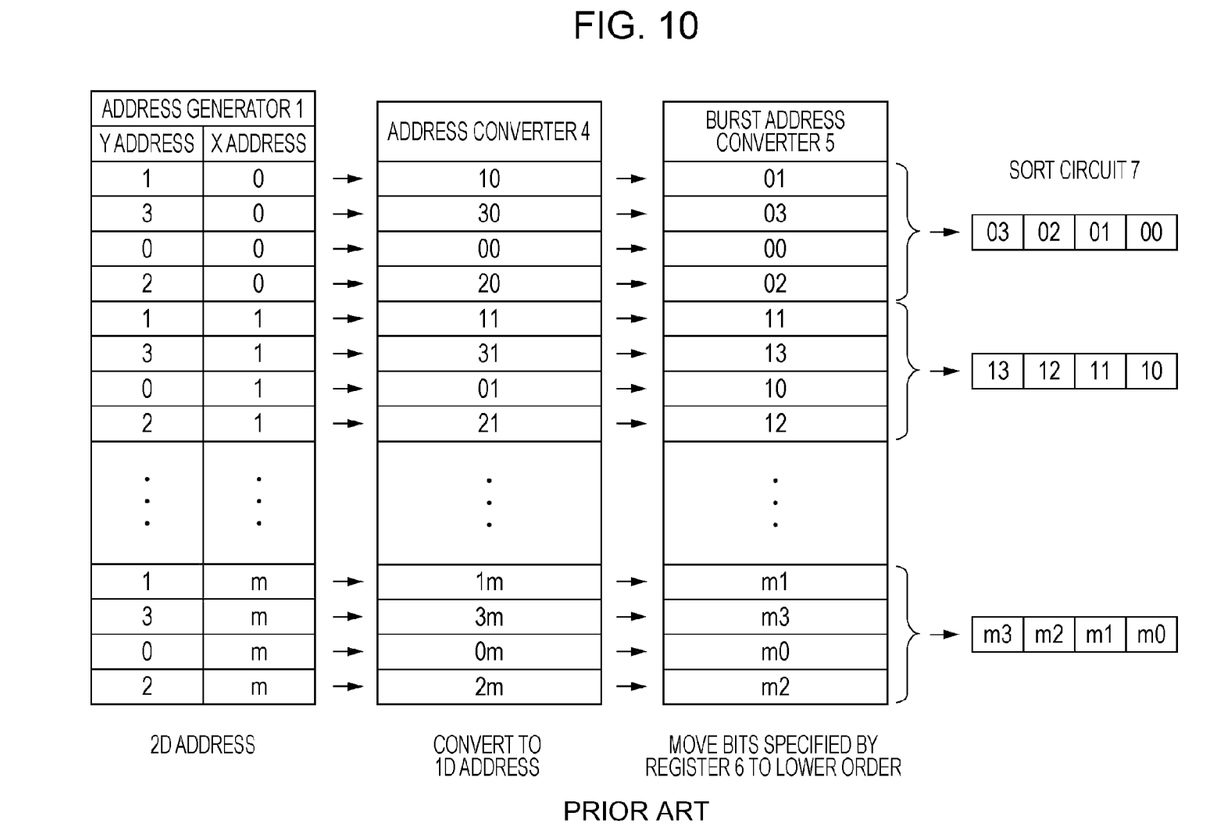
FIG. 10 explains one example of address conversion.

The operation of such a semiconductor test apparatus will now be described using FIGS. 9 and 10. FIG. 9 explains one example of a memory cell in a memory device set as a DUT. FIG. 10 explains one example of address conversion.

Herein, the case of testing a memory cell in memory like that illustrated in FIG. 9 will be described by way of example. The memory cell illustrated in FIG. 9 has m X addresses (where m is an integer equal to or greater than 0), and n Y addresses (where n is an integer equal to or greater than 0). This memory cell is tested by varying the address as indicated by the arrow in FIG. 9.

First, an operation for writing data to the memory cell of the DUT 100 is conducted. The address generator 1 generates a 2D address with X address 0, Y address 1 (hereinafter expressed simply as (0,1)). The data input/output unit 2 generates an address signal on the basis of this 2D address, and outputs the address signal to the DUT 100 together with a data signal and a control signal.

The address generator 1 then generates the 2D address (0,3). The data input/output unit 2 generates an address signal on the basis of this 2D address, and outputs the address signal to the DUT 100 together with a data signal and a control signal. This series of operations is repeated for the 2D addresses from (0,1) to (m,2).

Next, operations for reading out data from the memory cell of the DUT 100 and storing failure data in the acquisition memory 9 will be described. Similarly to the write operation, the address generator 1 generates the 2D address (0,1). The data input/output unit 2 generates an address signal on the basis of this 2D address, and outputs the address signal to the DUT 100 together with a control signal.

The data written at the address (0,3) of the DUT 100 is then output, and input into the data input/output unit 2. In the data input/output unit 2, the data that was input from the DUT 100 is compared against a comparison voltage by a comparator (not shown), and the output signal from the comparator is then compared to expected value pattern data to make a pass/fail decision. The failure data obtained as a result of this decision is output from the data input/output unit 2 to the sort circuit 7.

Meanwhile, the 2D addresses that were generated by the address generator 1 are converted by the address converter 4, the burst address converter 5, and the sort circuit 7. A specific example of this series of conversions will now be described using FIG. 10. From the address generator 1, the 2D addresses from (0,1) to (m,2) are successively generated, and input into the address converter 4.

The address converter 4 converts the 2D addresses from the address generator 1 into 1D addresses. In the example illustrated in FIG. 10, the 2D addresses are converted into 1D addresses by simply concatenating each Y address and X address from the address generator 1. In other words, the Y address is placed at the higher order bit in the 1D address, while the X address is placed at the lower order bit.

Looking at the 1D addresses, it can be seen that the 1D addresses do not vary continuously. More specifically, the first four addresses converted by the address converter 4 vary as follows: 10, 30, 00, 20. Similarly, the next four addresses vary as follows: 11, 31, 01, 21.

When viewed in groups of four addresses, it is the higher order bit of the 1D addresses that varies. In the register 6, this varying bit is set in advance as conversion bit information. On the basis of the conversion bit information in the register 6, the burst address converter 5 moves bits in the 1D addresses from the address converter 4.

In the example illustrated in FIG. 10, the burst address converter 5 moves the higher order bit to the lower order bit in the 1D addresses from the address converter 4. The sort circuit 7 then takes the 1D addresses that have been substituted by the burst address converter 5, as well as the failure data corresponding to those 1D addresses, and performs a sort such that the addresses become continuous in accordance with the burst length used during burst access of the acquisition memory 9.

In the example illustrated in FIG. 10, the burst length is taken to be 4. Consequently, the sort circuit 7 sorts and outputs four addresses and failure data as a single unit. On the basis of the 1D addresses and failure data sorted by the sort circuit 7, the memory controller 8 generates an address signal, data signal, and control signal for the acquisition memory 9. The memory controller 8 then writes the failure data to the acquisition memory 9 using burst access.

In this way, when writing failure data to the acquisition memory 9, 2D addresses generated by the address generator 1 are converted into 1D addresses by the address converter 4, and the burst address converter 5 moves bits in these 1D addresses on the basis of conversion bit information in the register 6. Subsequently, the sort circuit 7 sorts the 1D addresses and failure data such that the addresses become continuous in accordance with the burst length. In so doing, the continuity of the 1D addresses can be kept, and the failure data can be written to the acquisition memory 9 using burst access. For this reason, the time to write failure data to the acquisition memory 9 can be reduced.

Japanese Unexamined Patent Application Publication No. 2008-052770 discloses a semiconductor test apparatus that enables the test time to be reduced by improving the transfer efficiency of failure information.

SUMMARY OF THE INVENTION

However, in the examples of the related art illustrated in FIGS. 8 to 10, sorting the 1D addresses and failure data with the sort circuit 7 requires that the number of continuous 1D addresses and failure data be equal to the burst length. If the number does not match the burst length, there is a problem in that the burst access functions of the acquisition memory 9 cannot be used, and the time to write failure data to the acquisition memory 9 increases.

For example, consider the case where the Y addresses range from 0 to 6 in the memory illustrated in FIG. 9, and wherein the burst length of the acquisition memory 9 is 4. First, testing is conducted by varying the address as indicated by the arrow in FIG. 9. In other words, the Y address will vary within the range from 0 to 3. The failure data at this point can be written to the acquisition memory 9 using the burst access functions, as described earlier.

Next, testing is conducted by varying the Y address within the range from 4 to 6. At this point, since the Y address varies every three data blocks within the range from 4 to 6, the number of continuous 1D addresses will not match the burst length of 4. Consequently, at this point, the burst access functions of the acquisition memory 9 cannot be used, and the time to write failure data to the acquisition memory 9 will increase.

In addition, in some cases, the test program created by the user will behave such that failure data that does not need to be written to the acquisition memory 9 (hereinafter referred to as irrelevant data) will be mixed in among the failure data and input into the sort circuit 7. Similar to the case described above, the number of failure data blocks will not match the burst length. For this reason, the burst access functions of the acquisition memory 9 cannot be used, and the time to write failure data to the acquisition memory 9 will increase.

Since the time to write failure data to the acquisition memory 9 increases as described above, a problem exists when implementing an interleaved technique, in that a large number of memory devices constituting the acquisition memory become necessary.

A semiconductor test apparatus is disclosed that is able to write failure data to acquisition memory 9 using burst access, even in cases when the number of addresses and failure data does not match the burst length or when irrelevant data is mixed in with the failure data, and wherein the number of memory devices constituting the acquisition memory can be reduced.

A semiconductor test apparatus in accordance with an embodiment sorts addresses corresponding to memory cells in memory provided in a device under test, as well as failure data obtained as a result of testing the memory cells, and stores the sorted addresses and failure data in acquisition memory using burst access. The semiconductor test apparatus includes: an address generator configured to generate a burst target signal, which indicates that the addresses and failure data are target data for burst access; and a sort circuit configured to sort the addresses and failure data in order of continuous addresses suitable for burst access, on the basis of the burst target signal.

A semiconductor test apparatus in accordance with another embodiment sorts addresses corresponding to memory cells in memory provided in a device under test, as well as failure data obtained as a result of testing the memory cells, and stores the sorted addresses and failure data in acquisition memory using burst access. The semiconductor test apparatus includes: an address generator configured to generate a burst target signal, which indicates that the addresses and failure data are target data for burst access, as well as a burst stop signal, which indicates the end of the target data for burst access; and a sort circuit configured to sort the addresses and failure data in order of continuous addresses suitable for burst access, on the basis of the burst target signal and the burst stop signal.

In the case where the addresses and failure data to be sorted on the basis of the burst target signal do not satisfy the number of data blocks required for burst access with respect to the acquisition memory, the sort circuit may append one or more dummy addresses and dummy failure data to the addresses and failure data.

In the case where the addresses and failure data are plurally split, the address generator may generate a plurality of burst target signals that respectively correspond to the split addresses and failure data.

In the case where the addresses and failure data are plurally split, the address generator may generate a plurality of burst stop signals that respectively correspond to the split addresses and failure data.

A semiconductor test apparatus in accordance with another embodiment sorts addresses corresponding to memory cells in memory provided in a device under test, as well as failure data obtained as a result of testing the memory cells, and stores the sorted addresses and failure data in acquisition memory using burst access. The semiconductor test apparatus includes: an address generator configured to generate a multi-bit burst stop signal, which indicates the end of the target data for burst access; and a sort circuit configured to receive as input addresses and failure data that have been split into a number of ways equal to or greater than the number of data blocks required for burst access, and sort the addresses and failure data in order of continuous addresses suitable for burst access, on the basis of the burst stop signal.

According to an embodiment, advantages such as the following are achieved. A semiconductor test apparatus sorts addresses corresponding to memory cells in memory provided in a device under test, as well as failure data obtained as a result of testing the memory cells, and stores the sorted addresses and failure data in acquisition memory using burst access. The semiconductor test apparatus is provided with: an address generator configured to generate a burst target signal, which indicates that the addresses and failure data are target data for burst access; and a sort circuit configured to sort the addresses and failure data in order of continuous addresses suitable for burst access, on the basis of the burst target signal. In so doing, failure data can be written to acquisition memory using burst access, even when irrelevant data is mixed in with the failure data.

In addition, a semiconductor test apparatus sorts addresses corresponding to memory cells in memory provided in a device under test, as well as failure data obtained as a result of testing the memory cells, and stores the sorted addresses and failure data in acquisition memory using burst access. The semiconductor test apparatus is provided with: an address generator configured to generate a burst target signal, which indicates that the addresses and failure data are target data for burst access, as well as a burst stop signal, which indicates the end of the target data for burst access; and a sort circuit configured to sort the addresses and failure data in order of continuous addresses suitable for burst access, on the basis of the burst target signal and the burst stop signal. In so doing, failure data can be written to acquisition memory using burst access, even when the number of addresses and failure data does not match the burst length or when irrelevant data is mixed in with the failure data.

Furthermore, by writing to acquisition memory using burst access, the write speeds of the memory devices constituting the acquisition memory can be maximized (i.e., information can be written to the acquisition memory at high speeds). For this reason, the number of memory devices constituting the acquisition memory can be reduced, even in cases where an interleaved technique is implemented.

DESCRIPTION OF THE PREFERRED EMBODIMENTS

Figure 1:
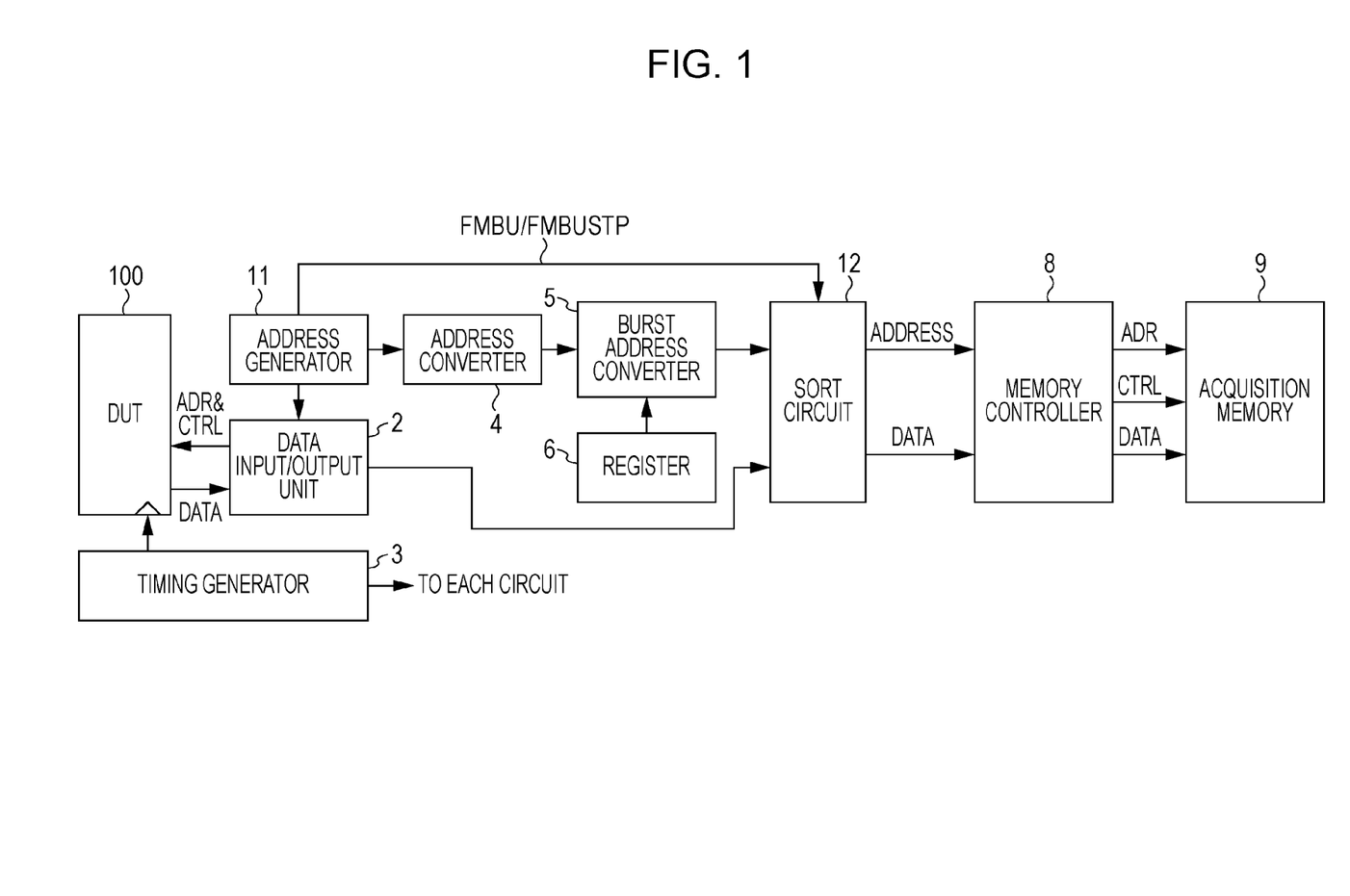
FIG. 1 illustrates a semiconductor test apparatus.

Hereinafter, embodiments will be described using the drawings. FIG. 1 illustrates a semiconductor test apparatus in accordance with an embodiment. FIG. 1 differs from the configuration illustrated in FIG. 8 in that an address generator 11 is provided instead of the address generator 1, and a sort circuit 12 is provided instead of the sort circuit 7.

In FIG. 1, in addition to the functions of the address generator 1 of the related art, the address generator 11 generates the following: a burst target signal, which indicates that particular failure data is target data for burst access; and a burst stop signal, which indicates the end of the target data for burst access.

The sort circuit 12 sorts addresses and failure data on the basis of the burst target signal, and recognizes the number of target data blocks for burst access on the basis of the burst stop signal. In addition, in cases where the addresses and failure data to be sorted on the basis of the burst target signal do not satisfy the required number of data blocks for burst access of the acquisition memory 9 (i.e., when the target data for burst access does not satisfy the burst length), the sort circuit 12 appends dummy addresses and dummy failure data to the addresses and failure data. Typically, the failure data is taken to be pass data.

Figure 2:
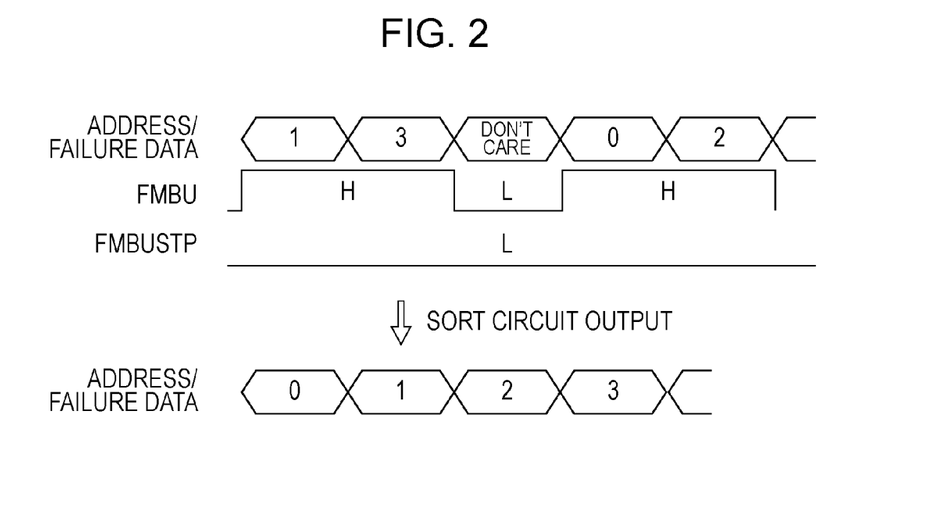
FIG. 2 explains the case of sorting while removing irrelevant data in 4-burst mode.
Figure 3:
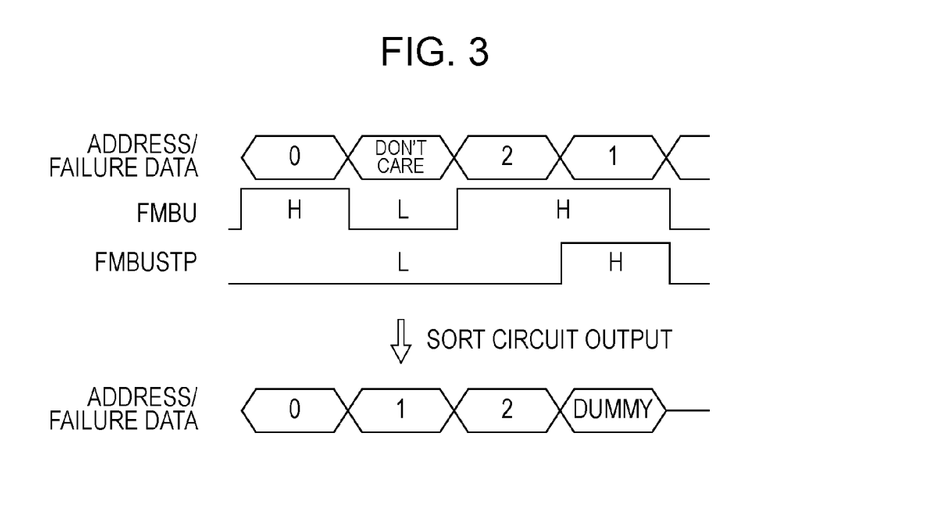
FIG. 3 explains the case of sorting while removing irrelevant data in 4-burst mode, and ending the sort with three data blocks.
Figure 4:
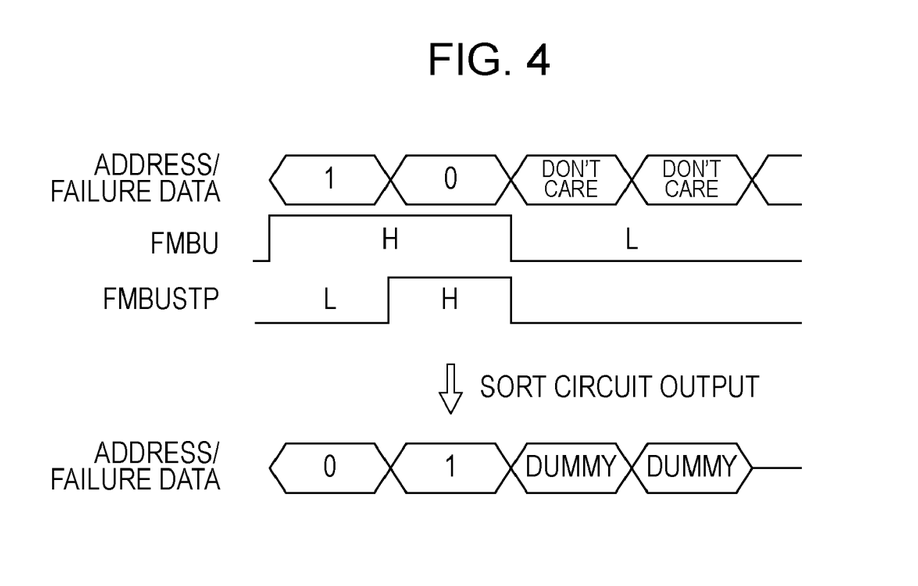
FIG. 4 explains the case of sorting while removing irrelevant data in 4-burst mode, and ending the sort with two data blocks.

The operation of such a semiconductor test apparatus will now be described using FIGS. 2 to 4. FIG. 2 explains the case of sorting while removing irrelevant data in 4-burst mode. FIG. 3 explains the case of sorting while removing irrelevant data in 4-burst mode, and ending the sort with three data blocks. FIG. 4 explains the case of sorting while removing irrelevant data in 4-burst mode, and ending the sort with two data blocks.

In the drawings, "Don't Care" indicates failure data that does not need to be written to the acquisition memory 9 (i.e., irrelevant data). The numbers in the drawings indicate the burst access order when accessing the acquisition memory 9. Also, the FMBU signal in the drawings represents the burst target signal, with the signal becoming true when the corresponding failure data is a burst access target. The FMBUSTP signal in the drawings represents the burst stop signal, with the signal becoming true when the corresponding failure data is the end of the burst access target.

Since writing data to the DUT 100 and reading data from the DUT 100 is the same as that of the example of the related art illustrated in FIG. 8, further description thereof is omitted. Herein, the writing of failure data to the acquisition memory 9 after data has been read from the DUT 100 will be described. In addition, in the examples illustrated in FIGS. 2 to 4, the burst length for burst access of the acquisition memory 9 is taken to be 4-burst.

In FIG. 2, addresses and failure data are input into the sort circuit 12 in the following order: 1, 3, Don't Care, 0, 2. The FMBU signal becomes true at high level, and false at low level. Since the Don't Care addresses and failure data are not targets for burst access, the address generator 11 switches the FMBU signal to low level in synchronization with the Don't Care addresses and failure data. In contrast, since all addresses and failure data other than the Don't Care information are targets for burst access, the address generator 11 switches the FMBU signal to high level in synchronization with all addresses and failure data other than the Don't Care information.

In addition, in the example illustrated in FIG. 2, the number of addresses and failure data matches the burst length. For this reason, the address generator 11 switches the FMBUSTP signal to low level. The sort circuit 12 sorts addresses and failure data input from the burst address converter 5, on the basis of the FMBU signal and the FMBUSTP signal input from the address generator 11 in synchronization with the addresses and failure data.

More specifically, the sort circuit 12 takes the addresses and failure data for which the FMBU signal is at high level, and sorts in order of continuous addresses. As a result, the sort circuit 12 outputs the addresses and failure data in the following order: 0, 1, 2, 3.

Next, the example in FIG. 3 illustrates the case wherein the burst length is 4-burst, the addresses and failure data input into the sort circuit 12 contain irrelevant data, and wherein the number of addresses and failure data blocks is three. In FIG. 3, the addresses and failure data are input into the sort circuit 12 in the following order: 0, Don't Care, 2, 1.

In the example illustrated in FIG. 3, the number of addresses and failure data does not match the burst length. For this reason, the address generator 11 switches the FMBUSTP signal to high level at the address and failure data that forms the end of the burst access target. In FIG. 3, the 1st address and failure data forms the end of the burst access target, and thus the address generator 11 switches the FMBUSTP signal to high level in synchronization with the 1st address and failure data. The sort circuit 12 sorts the addresses and failure data input from the burst address converter 5, on the basis of the FMBU signal and FMBUSTP signal input from the address generator 11 in synchronization with the addresses and failure data.

More specifically, the sort circuit 12 takes the addresses and failure data for which the FMBU signal is at high level, and sorts in order of continuous addresses. In addition, the sort circuit 12 recognizes the number of target data blocks for burst access by the 1st address and failure data for which the FMBUSTP signal is at high level. In the example illustrated in FIG. 3, there are three addresses and failure data blocks for which the FMBU signal is at high level before the FMBUSTP signal switches to high level. For this reason, the sort circuit 12 appends one set of a dummy address and dummy failure data to the sorted addresses and failure data, in order to match the burst length of 4-burst.

As a result, the sort circuit 12 outputs the addresses and failure data in the following order: 0, 1, 2. In addition, the sort circuit 12 outputs one set of a dummy address and dummy failure data. This dummy address and dummy failure data becomes a substitute for the 3rd address and failure data in burst access.

Next, the example in FIG. 4 illustrates the case wherein the burst length is 4-burst, the addresses and failure data input into the sort circuit 12 contain irrelevant data, and wherein the number of addresses and failure data blocks is two. In FIG. 4, the addresses and failure data are input into the sort circuit 12 in the following order: 1, 0, Don't Care, Don't Care.

In the example illustrated in FIG. 4, the number of addresses and failure data does not match the burst length. For this reason, the address generator 11 switches the FMBUSTP signal to high level at the address and failure data that forms the end of the burst access target. In FIG. 4, the 0th address and failure data forms the end of the burst access target, and thus the address generator 11 switches the FMBUSTP signal to high level in synchronization with the 0th address and failure data. The sort circuit 12 sorts the addresses and failure data input from the burst address converter 5, on the basis of the FMBU signal and FMBUSTP signal input from the address generator 11 in synchronization with the addresses and failure data.

More specifically, the sort circuit 12 takes the addresses and failure data for which the FMBU signal is at high level, and sorts in order of continuous addresses. In addition, the sort circuit 12 recognizes the number of target data blocks for burst access by the 0th address and failure data for which the FMBUSTP signal is at high level. In the example illustrated in FIG. 4, there are two addresses and failure data blocks for which the FMBU signal is at high level before the FMBUSTP signal switches to high level. For this reason, the sort circuit 12 appends two sets of a dummy address and dummy failure data to the sorted addresses and failure data, in order to match the burst length of 4-burst.

As a result, the sort circuit 12 outputs the addresses and failure data in the following order: 0, 1. In addition, the sort circuit 12 outputs two sets of a dummy address and dummy failure data. The first dummy address and dummy failure data becomes a substitute for the 2nd address and failure data in burst access, while the next dummy address and dummy failure data becomes a substitute for the 3rd address and failure data in burst access.

In this way, the address generator 11 generates an FMBU signal, which indicates that particular addresses and failure data are target data for burst access, as well as an FMBUSTP signal, which indicates the end of the target data for burst access. On the basis of the FMBU signal and the FMBUSTP signal, the sort circuit 12 sorts the addresses and failure data, and appends dummy addresses and dummy failure data. In so doing, failure data can be written to acquisition memory using burst access, even in cases when the number of addresses and failure data does not match the burst length, or when irrelevant data is mixed in with the failure data. Moreover, when implementing an interleaved technique, the number of memory devices constituting the acquisition memory can be reduced.

It should be appreciated that the present invention is not limited to the foregoing, and may also be configured as expressed below, for example.

(1) In the embodiment illustrated in FIG. 1, the sort circuit 12 is illustrated as being disposed after the burst address converter 5. However, the sort circuit 12 may also be disposed between the address converter 4 and the burst address converter 5. In this case, the sort circuit 12 sorts 1D addresses from the address converter 4 and failure data from the data input/output unit, and then the burst address converter 5 moves bits in the sorted addresses. Subsequently, the memory controller 8 writes to the acquisition memory 9 using the addresses from the burst address converter 5 and the failure data from the sort circuit 12.

(2) In the embodiment illustrated in FIGS. 1 to 4, the address generator 11 is configured to generate one FMBU signal and one FMBUSTP signal, respectively. However, if addresses and failure data are plurally split and input into the sort circuit 12 by means of an interleaved technique, then the address generator 11 may be configured to generate an FMBU signal and an FMBUSTP signal that are also plurally split in accordance with the respective addresses and failure data.

Figure 5:
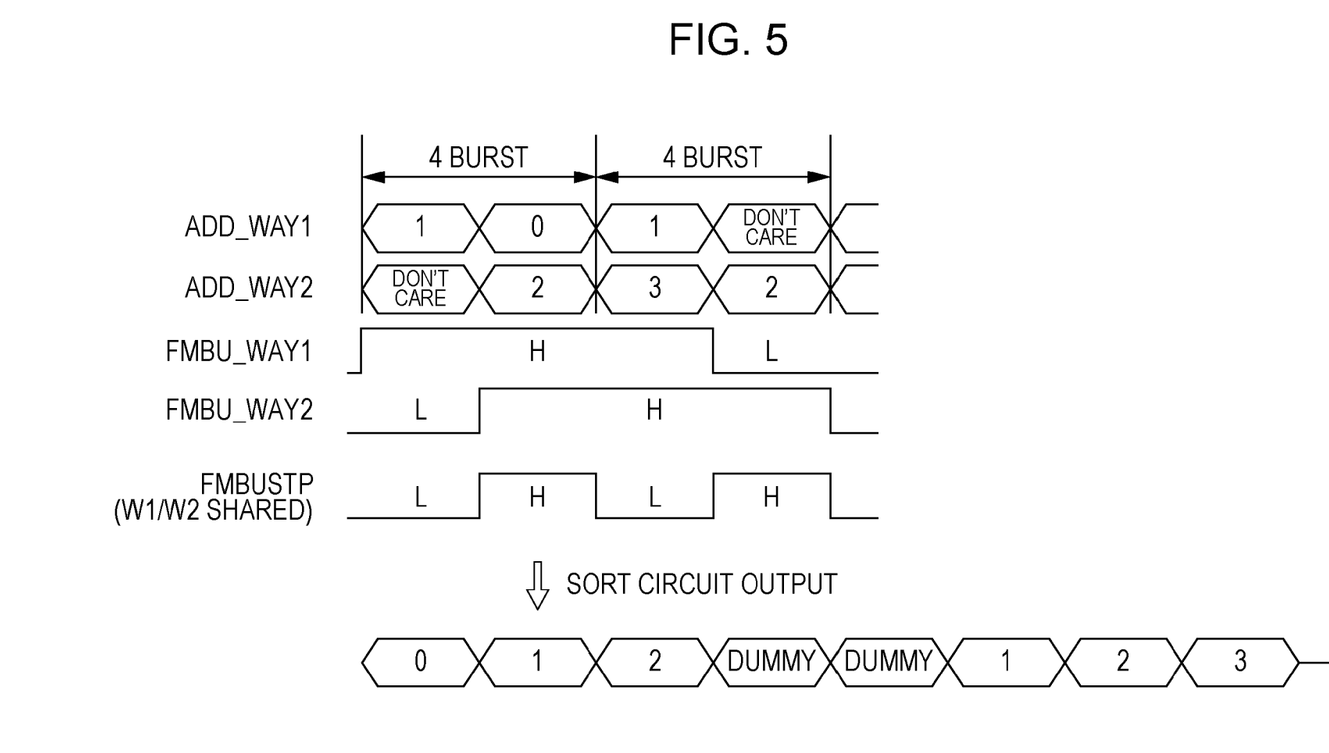
FIG. 5 explains the case of sorting 2-way split addresses and failure data in 4-burst mode.
Figure 6:
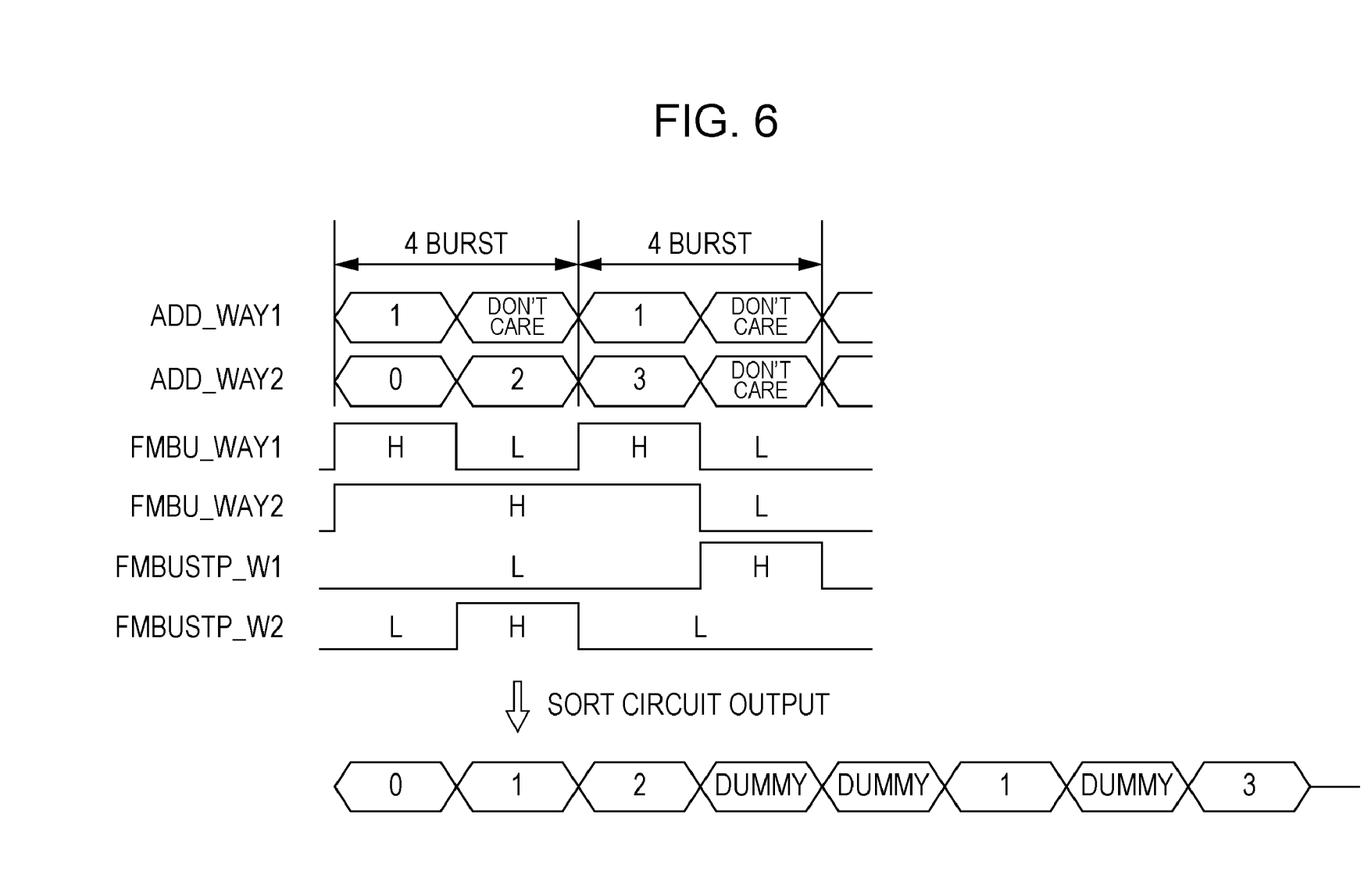
FIG. 6 explains the case of sorting 2-way split addresses and failure data in 4-burst mode.

The operation of such a semiconductor test apparatus will now be described using FIGS. 5 and 6. FIGS. 5 and 6 explain cases of sorting 2-way split addresses and failure data in 4-burst mode. FIG. 5 illustrates the case where separate FMBU signals and a shared FMBUSTP signal are used with respect the split addresses and failure data. FIG. 6 illustrates the case where separate FMBU signals and separate FMBUSTP signals are used with respect to the split addresses and failure data.

In FIG. 5, the addresses and failure data are 2-way split into ADD_WAY1 and ADD_WAY2, respectively. ADD_WAY1 is input into the sort circuit 12 in the following order: 1, 0, 1, Don't Care. ADD_WAY2 is input into the sort circuit 12 in the following order: Don't Care, 2, 3, 2. The FMBU signal is also split into an FMBU_WAY1 signal and an FMBU_WAY2 signal. The FMBU_WAY1 signal corresponds to the addresses and failure data on the ADD_WAY1 way, while the FMBU_WAY2 signal corresponds to the addresses and failure data on the ADD_WAY2 way. The FMBUSTP signal is shared between ADD_WAY1 and ADD_WAY2.

The example illustrated in FIG. 5 includes Don't Care information, and thus the number of addresses and failure data does not match the burst length. For this reason, the address generator 11 switches the FMBUSTP signal to high level at the address and failure data that forms the end of the burst access target. In the first 4-burst of addresses and failure data, the 0th address and failure data in ADD_WAY1 (the 2nd address and failure data in ADD_WAY2) forms the end of the burst access target, and thus the address generator 11 switches the FMBUSTP signal to high level at these addresses and failure data.

The sort circuit 12 takes the addresses and failure data for which the FMBU_WAY1 signal and the FMBU_WAY2 signal are at high level, and sorts in order of continuous addresses. In addition, the sort circuit 12 recognizes the number of target data blocks for burst access by the addresses and failure data for which the FMBUSTP signal is at high level.

In the first 4-burst of addresses and failure data in FIG. 5, there are a total of three addresses and failure data blocks for which the FMBU_WAY1 signal and the FMBU_WAY2 signal are at high level before the FMBUSTP signal switches to high level. For this reason, the sort circuit 12 appends one set of a dummy address and dummy failure data to the sorted addresses and failure data, in order to match the burst length of 4-burst.

Similarly, the sort circuit 12 also sorts the next 4-burst of addresses and failure data. As a result, the sort circuit 12 outputs the first 4-burst of addresses and failure data in the following order: 0, 1, 2. In addition, the sort circuit 12 outputs one set of a dummy address and dummy failure data. This dummy address and dummy failure data becomes a substitute for the 3rd address and failure data in burst access.

Subsequently, the sort circuit 12 outputs the next 4-burst by first outputting one set of a dummy address and dummy failure data, and then outputting addresses and failure data in the following order: 1, 2, 3. This dummy address and failure data becomes a substitute for the 0th address and failure data in burst access.

In FIG. 6, the addresses and failure data are 2-way split into ADD_WAY1 and ADD_WAY2, similarly to FIG. 5. ADD_WAY1 is input into the sort circuit 12 in the following order: 1, Don't Care, 1, Don't Care. ADD_WAY2 is input into the sort circuit 12 in the following order: 0, 2, 3, Don't Care.

The FMBU signal is also split into an FMBU_WAY1 signal and an FMBU_WAY2 signal, while the FMBUSTP signal is split into an FMBUSTP_W1 signal and an FMBUSTP_W2 signal. The FMBU_WAY1 signal and the FMBUSTP_W1 signal correspond to the addresses and failure data on the ADD_WAY1 way, while the FMBU_WAY2 signal and the FMBUSTP_W2 signal correspond to the addresses and failure data on the ADD_WAY2 way.

The example illustrated in FIG. 6 includes Don't Care information, and thus the number of addresses and failure data does not match the burst length. For this reason, the address generator 11 switches the FMBUSTP_W1 signal and the FMBUSTP_W2 signal to high level at the addresses and failure data that form the end of the burst access target. In the first 4-burst of addresses and failure data, the 2nd address and failure data in ADD_WAY2 forms the end of the burst access target, and thus the address generator 11 switches the FMBUSTP_W2 signal to high level at this address and failure data.

The sort circuit 12 takes the addresses and failure data for which the FMBU_WAY1 signal and the FMBU_WAY2 signal are at high level, and sorts in order of continuous addresses. In addition, the sort circuit 12 recognizes the number of target data blocks for burst access by the addresses and failure data for which the FMBUSTP signal is at high level.

In the first 4-burst of addresses and failure data in FIG. 6, there are a total of three addresses and failure data blocks for which the FMBU_WAY1 signal and the FMBU_WAY2 signal are at high level before the FMBUSTP signal switches to high level. For this reason, the sort circuit 12 appends one set of a dummy address and dummy failure data to the sorted addresses and failure data, in order to match the burst length of 4-burst.

Similarly, the sort circuit 12 also sorts the next 4-burst of addresses and failure data. At this point, the address generator 11 has switched the FMBUSTP_W1 signal to high level for the Don't Care data (i.e., the irrelevant data). However, the FMBU_WAY1 signal and the FMBU_WAY2 signal are both at low level. For this reason, the resulting operation is no different than when the FMBUSTP_W2 signal is switched to high level for the 3rd address and failure data in ADD_WAY2.

As a result, the sort circuit 12 outputs the first 4-burst of addresses and failure data in the following order: 0, 1, 2. In addition, the sort circuit 12 outputs one set of a dummy address and dummy failure data. This dummy address and dummy failure data becomes a substitute for the 3rd address and failure data in burst access.

Subsequently, the sort circuit 12 outputs the next 4-burst by outputting one set of a dummy address and dummy failure data, the 1st address and failure data, one set of a dummy address and dummy failure data, and the 3rd address and failure data, in that order. The first dummy address and dummy failure data becomes a substitute for the 0th address and failure data in burst access, while the next dummy address and dummy failure data becomes a substitute for the 2nd address and failure data in burst access.

(3) In the embodiment illustrated in FIGS. 1 to 4, the address generator 11 is configured to generate a single FMBUSTP signal. However, if addresses and failure data with a number of data blocks equal to or greater than the burst length are input into the sort circuit 12 by means of an interleaved technique, then the address generator 11 may be configured to generate a multi-bit FMBUSTP signal, and the sort circuit 12 may be configured to recognize the number of target data blocks for burst access on the basis of the multi-bit FMBUSTP signal.

Figure 7:
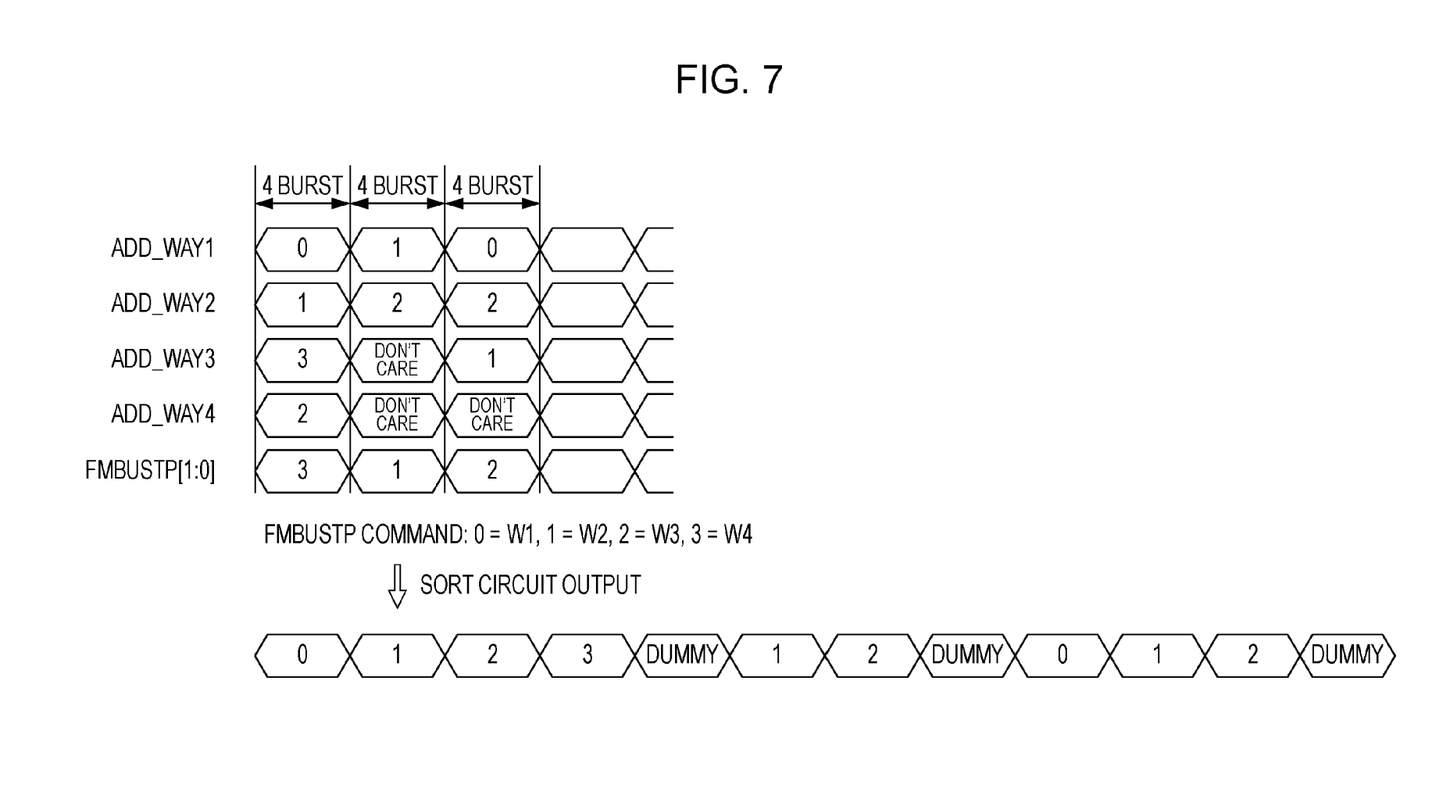
FIG. 7 explains the case of sorting 4-way split addresses and failure data in 4-burst mode.

The operation of such a semiconductor test apparatus will now be described using FIG. 7. FIG. 7 explains the case of sorting 4-way split addresses and failure data in 4-burst mode. In FIG. 7, the FMBUSTP signal is defined in a 2-bit command format.

An FMBUSTP signal value of 0 indicates that the addresses and failure data on ADD_WAY1 are target data for burst access, whereas the addresses and failure data on ADD_WAY2 to ADD_WAY4 are not target data for burst access.

An FMBUSTP signal value of 1 indicates that the addresses and failure data on ADD_WAY1 and ADD_WAY2 are target data for burst access, whereas the addresses and failure data on ADD_WAY3 and ADD_WAY4 are not target data for burst access.

An FMBUSTP signal value of 2 indicates that the addresses and failure data on ADD_WAY1 to ADD_WAY3 are target data for burst access, whereas the addresses and failure data on ADD_WAY4 are not target data for burst access.

An FMBUSTP signal value of 3 indicates that the addresses and failure data on ADD_WAY1 to ADD_WAY4 are target data for burst access.

On the basis of the FMBUSTP signal, the sort circuit 12 recognizes the target data for burst access. Subsequently, the sort circuit 12 sorts the target data, and when the number of data blocks does not satisfy the burst length, the sort circuit 12 appends and outputs one or more dummy addresses and dummy failure data, similarly to the embodiments illustrated in FIGS. 2 to 6.

(4) In the embodiments illustrated in FIGS. 1 to 6, the address generator 11 is configured to generate an FMBUSTP signal, and the sort circuit 12 is configured to sort addresses and failure data on the basis of the FMBUSTP signal. However, in cases where the number of addresses and failure data blocks set as the target data is guaranteed to match the burst length (such as the case illustrated in FIG. 2, for example), then the FMBUSTP signal may be eliminated, and sorting of the addresses and failure data may be conducted using just the FMBU signal.

(5) In the embodiments illustrated in FIG. 1 and FIGS. 3 to 7, the sort circuit 12 is configured to append and output one or more dummy addresses and dummy failure data in cases where the number of data blocks does not satisfy the burst length. However, a unit other than the sort circuit 12 may be configured to append the one or more dummy addresses and dummy failure data.

What is claimed is:

1. A semiconductor test apparatus that sorts addresses corresponding to memory cells in memory in a tested device, sorts failure data obtained as a result of testing the memory cells, and stores the sorted addresses and failure data in acquisition memory using burst access, comprising:
   an address generator configured to generate a burst target signal, which indicates that the addresses and failure data are target data for burst access, and to generate a burst stop signal, which indicates the end of the target data for burst access; and
   a sort circuit configured to sort the addresses and failure data in order of continuous addresses suitable for burst access, on the basis of the burst target signal and the burst stop signal,
   wherein in the case where the addresses and failure data to be sorted on the basis of the burst target signal do not satisfy the number of data blocks required for burst access with respect to the acquisition memory, the sort circuit appends one or more dummy addresses and dummy failure data making the result of testing as pass to the addresses and failure data.

2. The semiconductor test apparatus according to claim 1, wherein in the case where the addresses and failure data to be sorted on the basis of the burst target signal do not satisfy the number of data blocks required for burst access with respect to the acquisition memory, the sort circuit appends one or more dummy addresses and dummy failure data to the addresses and failure data.

3. The semiconductor test apparatus according to claim 2, wherein in the case where the addresses and failure data are plurally split, the address generator generates a plurality of burst target signals that respectively correspond to the split addresses and failure data.

4. The semiconductor test apparatus according to claim 3, wherein in the case where the addresses and failure data are plurally split, the address generator generates a plurality of burst stop signals that respectively correspond to the split addresses and failure data.

5. The semiconductor test apparatus according to claim 2, wherein in the case where the addresses and failure data are plurally split, the address generator generates a plurality of burst stop signals that respectively correspond to the split addresses and failure data.

6. The semiconductor test apparatus according to claim 1, wherein in the case where the addresses and failure data are plurally split, the address generator generates a plurality of burst target signals that respectively correspond to the split addresses and failure data.

7. The semiconductor test apparatus according to claim 6, wherein in the case where the addresses and failure data are plurally split, the address generator generates a plurality of burst stop signals that respectively correspond to the split addresses and failure data.

8. The semiconductor test apparatus according to claim 1, wherein in the case where the addresses and failure data are plurally split, the address generator generates a plurality of burst stop signals that respectively correspond to the split addresses and failure data.

9. A semiconductor test apparatus that sorts addresses corresponding to memory cells in memory provided in a tested device, sorts failure data obtained as a result of testing the memory cells, and stores the sorted addresses and failure data in acquisition memory using burst access, comprising:
- an address generator configured to generate a multi-bit burst stop signal, which indicates the end of the target data for burst access; and
- a sort circuit configured to receive as input addresses and failure data that have been split into a number of ways equal to or greater than the number of data blocks required for burst access, and sort the addresses and failure data in order of continuous addresses suitable for burst access, on the basis of the burst stop signal, wherein in the case where the addresses and failure data to be sorted on the basis of the burst stop signal do not satisfy the number of data blocks required for burst access with respect to the acquisition memory, the sort circuit appends one or more dummy addresses and dummy failure data making the result of testing as pass to the addresses and failure data.

* * * * *